United States Patent [19]

Van Der Vegte et al.

[11] 4,288,838
[45] Sep. 8, 1981

[54] ELECTRICAL SIGNAL TRANSMISSION EQUIPMENT BAY

[75] Inventors: Jan Van Der Vegte; Dirk G. Hek, both of Hilversum, Netherlands

[73] Assignee: U.S. Philips Corporation, New York, N.Y.

[21] Appl. No.: 58,580

[22] Filed: Jul. 18, 1979

[30] Foreign Application Priority Data

Aug. 24, 1978 [NL] Netherlands ............... 7808721

[51] Int. Cl.³ ................................ H05K 7/10
[52] U.S. Cl. ................... 361/383; 361/415; 361/428; 361/429; 174/72 A
[58] Field of Search ............... 361/428, 429, 381–384, 361/415; 339/17 M, 17 LM, 18 R, 148, 126 R, 176 MP; 179/91 R, 98, 99 R; 174/59, 72 A, 52 R

[56] References Cited

U.S. PATENT DOCUMENTS

| | | | |
|---|---|---|---|
| 3,801,873 | 4/1974 | Stumpf | 361/429 |
| 3,984,622 | 10/1976 | Ross | 174/72 A |
| 4,131,934 | 12/1978 | Becker | 361/428 |
| 4,158,754 | 6/1979 | Yonezaki | 361/429 |

OTHER PUBLICATIONS

Design-400 Publication, J. Van Der Vegte, Phillips Telecommunication Review, vol. 33, No. 3, Sep. 1975.

*Primary Examiner*—Gerald P. Tolin
*Attorney, Agent, or Firm*—Thomas A. Briody; William J. Streeter; Laurence A. Wright

[57] ABSTRACT

Figure 2:
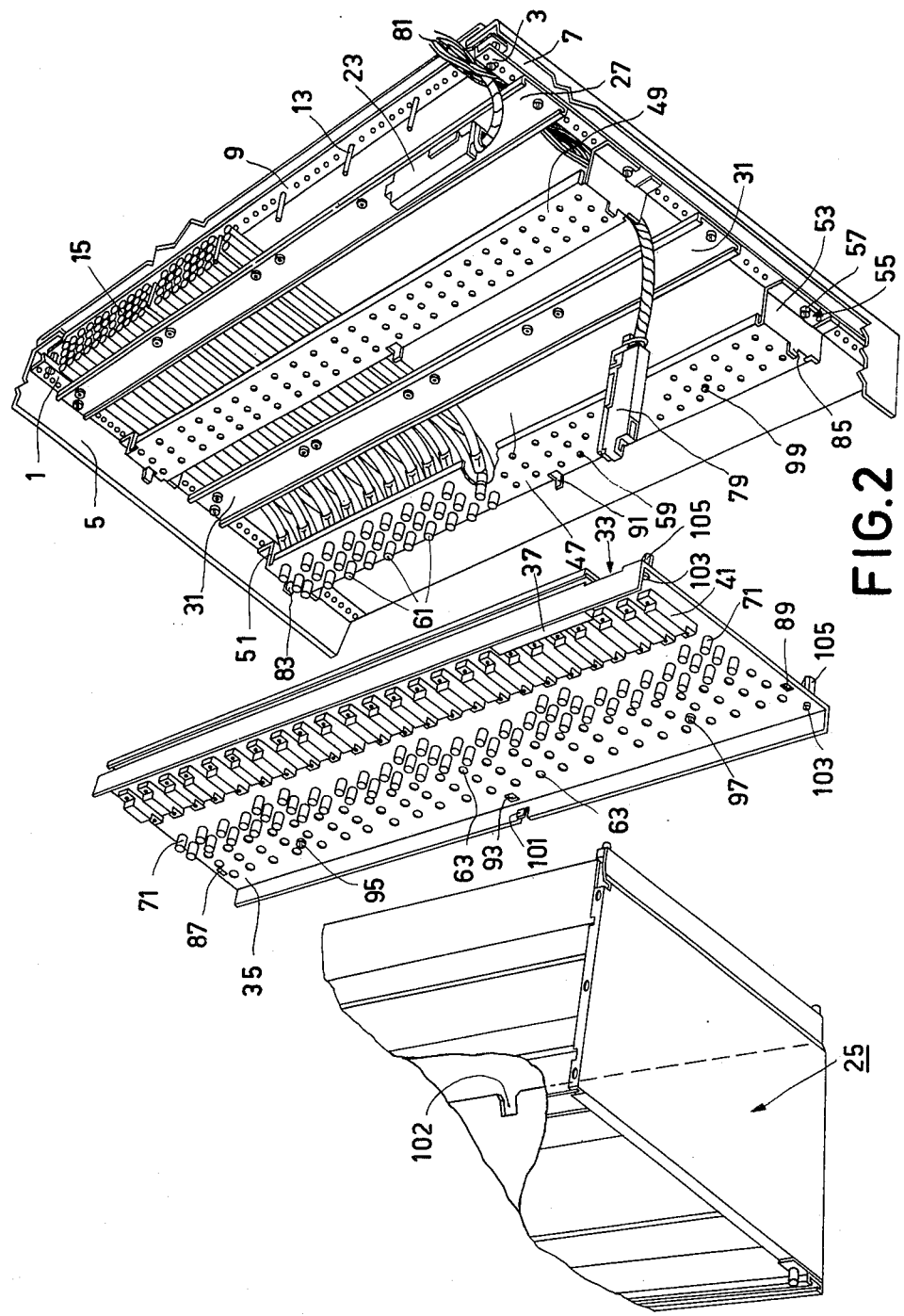

An electrical signal transmission equipment bay, comprising a number of ingoing and outgoing cables (81, 15) which are connected, by means of relevant row connectors (79) and coaxial connectors (61) to signal processing boards (19, see FIG. 3) contained in the functional units (25). The coaxial connectors (61) are prepositioned during mounting in openings (59) of a displaceable mounting beam (47) which is subsequently secured to a positioning plate (35) which comprises openings (63) wherethrough the coaxial connectors (61) are inserted. Subsequently the positioning plate (35) is rigidly connected to the supporting beams (1, 3) in the bay. The bay is particularly suitable for use in telephone exchanges. (FIG. 2).

8 Claims, 10 Drawing Figures

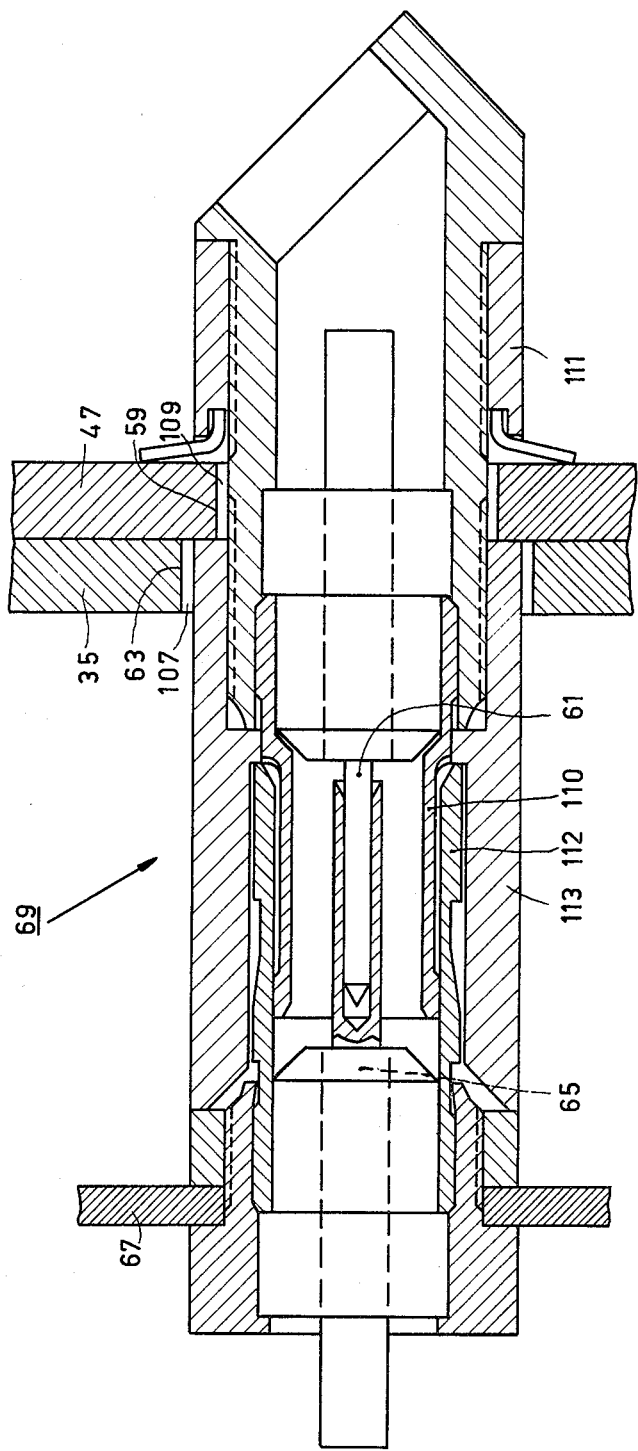

ELECTRICAL SIGNAL TRANSMISSION EQUIPMENT BAY

The invention relates to an electrical signal transmission equipment bay, comprising two parallel supporting beams wherebetween cable guide beams extend which are directed transversely of the supporting beams and which are situated in a first vertical plane, and also cables, going into and out of the bay, which are guided along the cable guide beams and which extend mainly parallel to the supporting beams inside the bay, the ends of a number of said cables being provided with a row connector for electrical connection to one of a number of plug-in signal processing boards, each accommodated in one of a number of functional units accommodated in the bay, via successively a row connector which is situated on a positioning plate for the respective functional unit, a master printed wiring board which is connected to the positioning plate, and a further row connector which is connected to the positioning plate and into which that signal processing board is plugged.

In a known bay of the described kind (Philips Telecommunication Review, Vol. 33, No. 3, September 1975, page 145), the positioning plate is provided with row connectors for so-called low-frequency ingoing and outgoing station cables, as well as with row connectors for low-frequency connections between the signal processing boards in a functional unit. As a result of the miniaturization of the signal processing boards, the number of signal processing boards per functional unit has increased and hence also the number of ingoing and outgoing station cables. The space between the cable guide beams and the positioning plate is thus occupied by ingoing and outgoing cables to such an extent that the accessibility of the cable ends provided with connectors is more different, and also the movability of the cable ends is substantially decreased. This movability and accessibility should be optimum for suitable connection of the connectors to the positioning plate in the comparatively small working space.

The problem concerning the connection of connectors has become still more significant since now, in addition to the low-frequency cables, use is also made of high-frequency cables of the coaxial type whose cable ends are provided with coaxial connectors. These coaxial connectors are to be secured on the positioning plate on which a connection is established with mating coaxial connectors provided on the signal processing boards. Because the so-called plugging tolerance of coaxial connectors is substantially smaller than the plugging tolerance for row connectors (in the low-frequency part of the positioning plate), it is difficult in the available small height working spaces between already mounted functional units to align the coaxial connectors on the cable ends so that their centres coincide with the centres of the mating coaxial connectors on the signal processing boards.

The invention has for its object to provide a bay in which the alignment of the coaxial connectors and mating connectors is facilitated, whilst said connectors are also readily accessible at the same time.

To this end, the invention is characterized in that between the supporting beams there is provided at least one mounting beam which extends transversely of the supporting beam and on which are positioned a number of coaxial connectors each connected to the end of one of the cables, said coaxial connectors cooperating, via a number of openings in said positioning plate, with a number of mating coaxial connectors which are provided on the signal processing boards in the respective functional unit, said mounting beam being adapted for detachable suspension from the supporting beams during the positioning of said coaxial connectors on the mounting beam, and being adapted for subsequent rigid connection to the positioning plate prior to rigid connection of the positioning plate to the supporting beams.

Because the mounting beam prealigns the coaxial connectors with respect to the apertures in the positioning plate, suitable mounting of the positioning plate is possible, followed by easy mounting of the signal processing boards in the functional units.

In order to prevent accurate positioning of the hole pattern in the positioning plate with respect to the hole pattern in the mounting beam from increasing the cost during the punching process, a preferred embodiment of the bay is characterized in that the mounting beam as well as the positioning plate is provided with openings through which the coaxial connectors are inserted with clearance.

Figure 1:
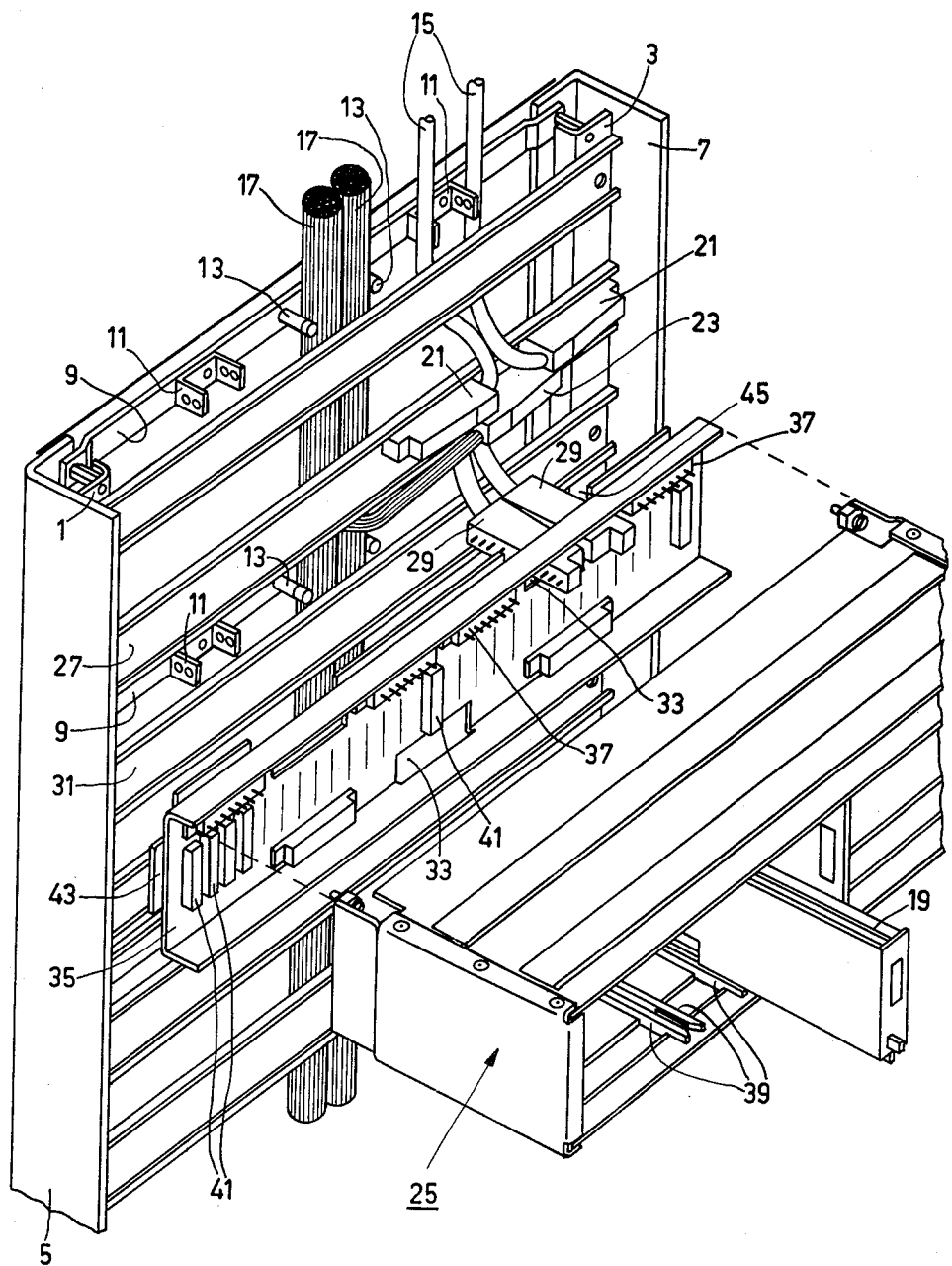
Figure 3:
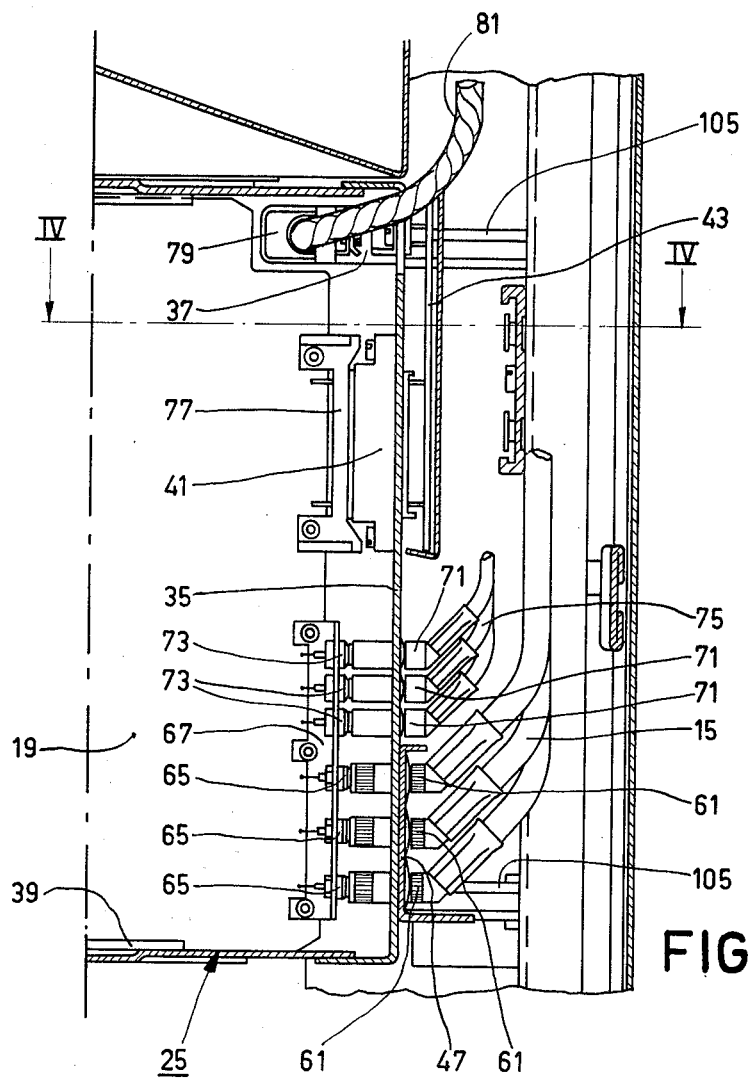
Figure 4:
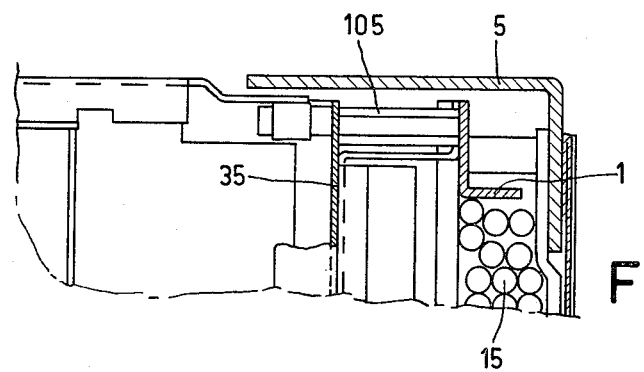
Figure 6:
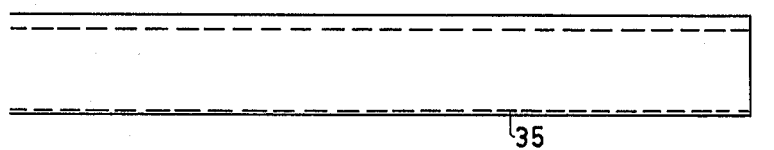
Figure 5:
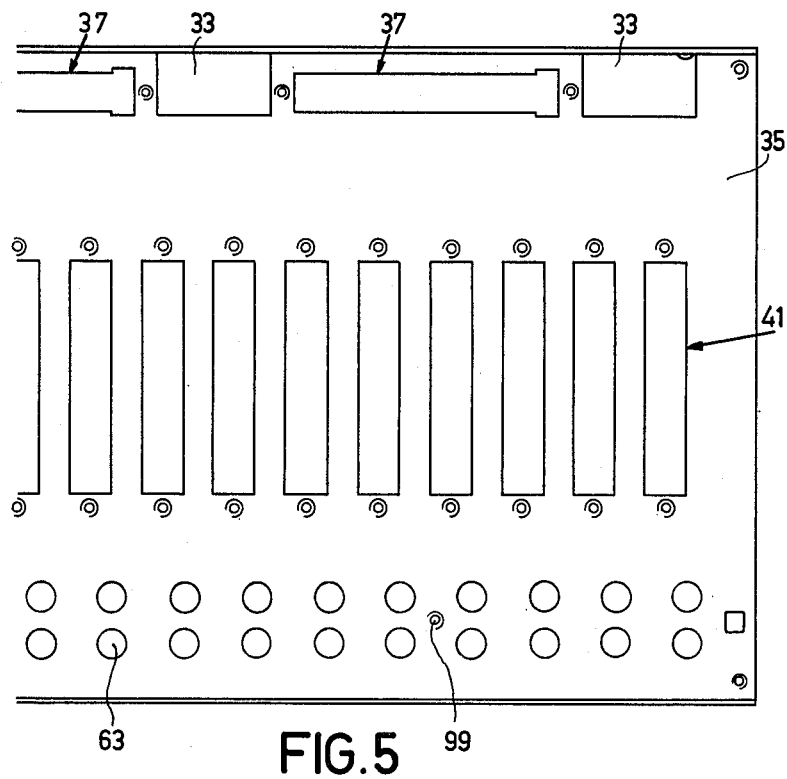
Figure 8:
Figure 7:
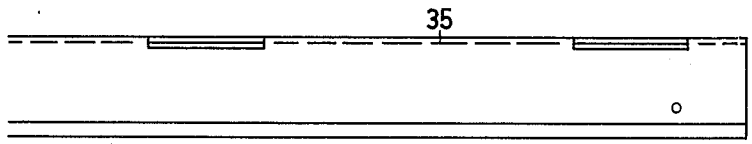
Figure 10:
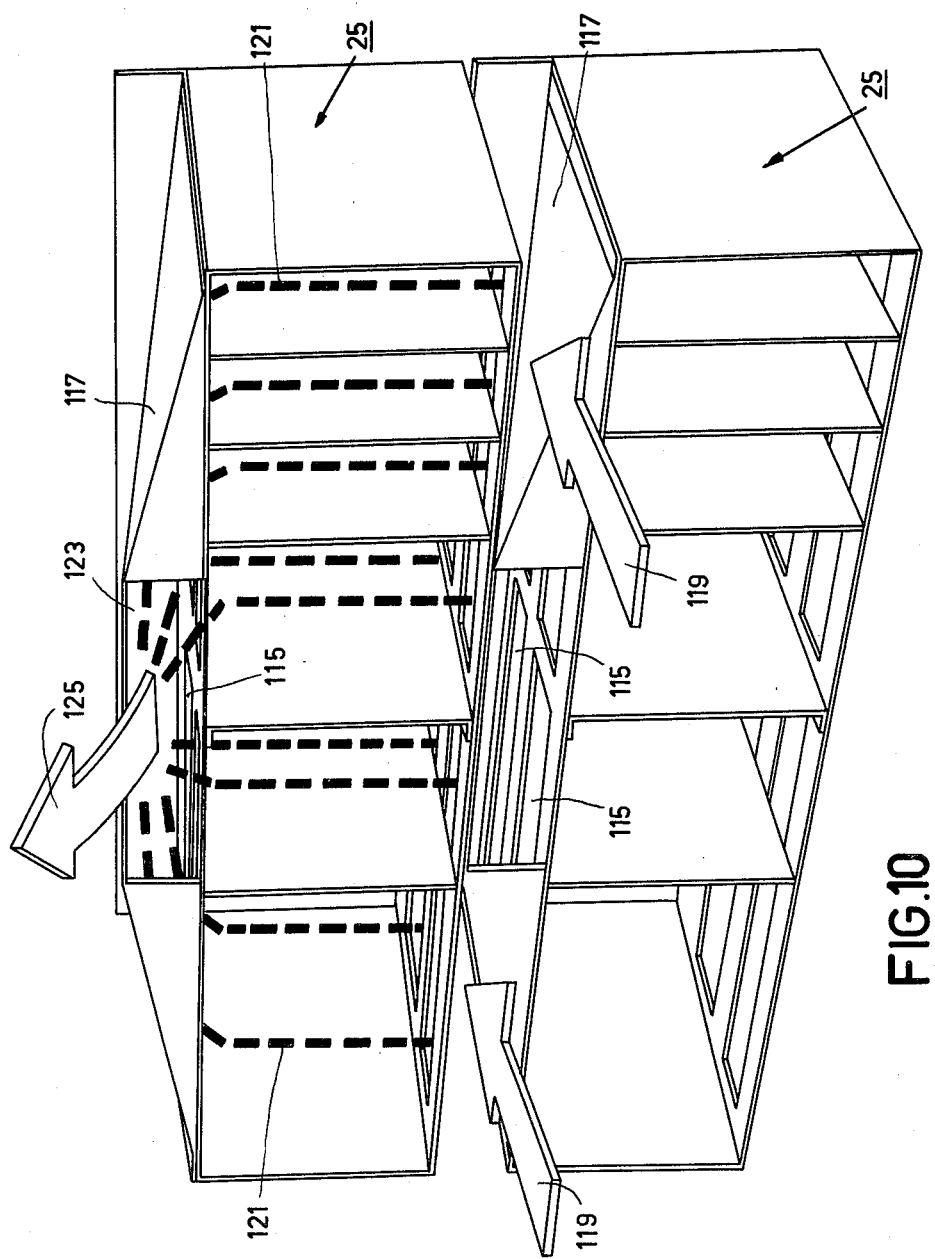

The invention will be described in detail hereinafter with reference to the accompanying diagrammatic drawing wherein:

FIG. 1 is a perspective view of a prior art bay,

FIG. 2 is a perspective view of a preferred embodiment of a bay in accordance with the invention, FIG. 3 is a vertical sectional view across the positioning plate and the mounting beam of the bay shown in FIG. 2, FIG. 4 is a horizontal sectional view, taken along the line IV—IV in FIG. 3, FIG. 5 is a view of one half of a positioning plate, FIG. 6 is an underview of the positioning plate shown in FIG. 5, FIG. 7 is a plan view of the positioning plate shown in FIG. 5, FIG. 8 is a side elevation of the positioning plate shown in FIG. 5, FIG. 9 is a longitudinal sectional view at an increased scale of a coaxial connection used in a bay as shown in FIG. 2, and FIG. 10 is a perspective view of two functional units used in a bay as shown in FIG. 2, a cooling device being arranged on top of each functional unit.

The prior art bay shown in FIG. 1 comprises two metal supporting beams 1 and 3 which extend parallel to each other and which have an L-shaped transverse profile, said beams being secured to relevant vertical columns 5 and 7 which form a lateral as well as a rear boundary of the bay. Between the supporting beams 1 and 3 there are provided a number of horizontal cable guide beams 9 which comprise brackets 11 and pins 13 for guiding station cables 15 going into and out of the bay and so-called internal cables 17 which inter alia serve for the power supply of signal processing boards 19 (only one signal processing board is visible.) The cables 15 and 17 extend mainly parallel to the supporting beams 1 and 3 and are uniformly distributed over the entire width of the bay when the bay is fully occupied. The cables 15 are provided near their ends with row connectors 21 of a customary type, whilst the cables 17 are provided near their ends with row connectors 23 which are also of a customary type. The row connectors 21 and 23 of a section of the bay which is not yet occupied by a functional unit 25 are connected for the time being to a horizontal parking beam 27 screwed onto the supporting beams 1 and 3. Before a section of the bay is occupied by a functional unit 25, the relevant row connectors are detached from the relevant parking beam. In the present case, a section which is situated underneath the parking beam 27 is occupied. To this end, inter alia relevant row connectors 29 are detached from a parking beam 31 and are subsequently inserted through a window 33 in a metal positioning plate 35. On the positioning plate 35 there are provided row connectors 37 whereto the row connectors 29 are connected. The positioning plate 35 is secured to the supporting beams 1 and 3 only after all relevant, previously parked row connectors have been inserted through the relevant windows of the positioning plate. Subsequently, these connectors are connected to the relevant row connectors on the positioning plate.

The functional unit 25 is mounted on the positioning plate 35 after the positioning plate 35 has been mounted on the supporting beams 1 and 3. The functional unit can then be filled with a number of signal processing boards only the signal processing board 19 thereof being shown for the sake of simplicity. The functional unit 25 comprises guides 39 for the sliding and plugging of the signal processing boards 19. The signal processing boards 19 comprise a printed wiring board on which a number of electrical components are mounted for the processing of electrical signals. In the present case, concerning bays intended for telephony, said components act on speech signals. On the positioning plate 35 a row connector 41 is provided for each signal processing board 19. The signal processing boards 19 are provided with a known plug section (not shown) which is inserted into the row connectors 41. On the rear of the positioning plate 35 there is provided a master board 43 which is mounted on the positioning plate and which is provided on both sides with printed wiring and also with plated-through holes. All row connectors (37 and 41) mounted on the positioning plate 35 comprise connection pins which are inserted, through openings in the positioning plate 35, into the plated-through holes of the master board 43. The electrical connection of these connection pins to the master board 43 is realized in one operation by wave-soldering before the mounting of the positioning plate 35. The master board 43 comprises recesses 45 for inserting the row connectors 29.

Due to the use of coaxial cables which are suitable for high frequencies and whose ends are provided with coaxial connectors, these coaxial connectors must be inserted through openings in the positioning plate for electrical connection to mating coaxial connectors provided on the signal processing boards 19. Contrary to row connectors, these coaxial connectors and mating connectors must be very accurately aligned in order to prevent damaging of the contact pins and the contact sockets. During the mounting of the positioning plate 35 on the supporting beams 1 and 3, however, hardly any space remains behind the positioning plate 35 for the maneuvering of the coaxial connectors. In the bay in accordance with the invention which is described hereinafter, the problem described with reference to the prior art bay is solved. The parts of the bay in accordance with the invention which correspond to the prior art bay are denoted by corresponding reference numerals (FIG. 1) and are not elaborated for the sake of brevity.

The coaxial part of the station cables going into and out of the bay shown in FIG. 2 is shown at the left. Underneath the parking beam 31 there is provided a horizontal mounting beam 47 of sheet metal (for example, steel). In the case of a plurality of sections which correspond to a plurality of functional units 25 of a bay, there is a repetitious pattern of mounting beams extending between two parking beams. For example, a mounting beam 49 is situated between the parking beams 27 and 31. The mounting beam 47 is bent at right angles twice near its left as well as near its right end, so that ears 51 and 53 are formed. In each of the ears 51 and 53 there is provided a recess 55, so that the mounting beam 47 can be loosely suspended from pins 57 screwed into the supporting beams 1 and 3. The size of the recess 55 and the diameter of the pin 57 are matched so that the mounting beam 47 can be shifted to the left as well as to the right and upwards and downwards with respect to the pins 57. Preferably, use is made of a pin in the form of a so-called shouldered bolt (bolt comprising a head and an abutment shoulder) which is screwed into the supporting beams 1 and 3 only so far that the ears 51 and 53 can still be slid forwards and backwards between the said head and the supporting beams 1 and 3. Obviously, the mounting beam 47 can be suspended in a displaceable manner from the supporting beams 1 and 3 in a variety of ways. The described method, utilizing the ears 51 and 53 which are formed by bending at right angles twice, offers the advantage that the ears 51 and 53 also provide adequate space for the cables behind the mounting beam. After having been suspended, the mounting beam 47 can thus be tilted and slid in all directions. The mounting beam 47 is provided with a regular pattern of holes 59. The ends of the coaxial cables 15 are provided with coaxial connectors 61 which can be inserted through the holes 59 with a clearance. In the lower part of the positioning plate 35 there is provided a pattern of holes 63 which corresponds to the pattern of holes 59 in the mounting beam 47. When the positioning plate 35 is mounted, the coaxial connectors 61 also project with a clearance through the holes 63 in the positioning plate 35. Coaxial connectors 65 which mate with the coaxial connectors 61 are mounted on the signal processing boards 19 (see FIG. 3) by means of L-shaped strips 67 which are secured on the signal processing boards 19. A coaxial connector 61 and the mating coaxial connector 65 is provided for each coaxial connection 69, the details of which will be described with reference to FIG. 9.

The FIGS. 2, 3 and 5 clearly show that the positioning plate 35 is subdivided into three sectors. Proceeding from the bottom upwards, there is provided a first sector which comprises the pattern of holes 63 for the coaxial connectors 61 which form coaxial connections 69 (see FIG. 9) in conjunction with the mating coaxial connectors 65 (see FIG. 3), said connections 69 being present in the coaxial station cables 15 going into and out of the bay. The coaxial connections 69 are usually installed at the site of a bay, so that the accessibility of these connections must be optimum for mounting. Above the pattern of holes 63 there is provided a further pattern of holes (not shown in FIG. 5 for the sake of simplicity) for inserting coaxial connectors 71 which are connected to mating coaxial connectors 73 which are provided on the L-shaped strips 67 of the signal processing boards 19. The coaxial connectors 71 and the mating coaxial connectors 73 together form coaxial connections of the same type as the coaxial connections 69 (see FIG. 9) and are used for interconnecting the signal processing boards 19 of the same functional unit 25. This is realized by means of coaxial cables 75 (see FIG. 3) which extend substantially horizontally behind the positioning plate 35. In FIG. 3, the coaxial cables 75 have been turned one quarter of a turn in order to make them visible. The third and upper section of the positioning plate 35 is occupied by the low-frequency row connectors 41 in which the signal processing boards 19 are plugged by way of row connectors 77 if present. The row connectors 41 are connected, via the master board 43 (see FIG. 3), to the row connectors 37 which are also situated in the third section. The row connectors 37 are connected, by way of row connectors 79 (see FIG. 2) inserted through the windows 33, to cables 81. The cables 81 serve for low-frequency connections going into and out of the bay. The cables 81, however, may also include cables for low-frequency connections between the signal processing boards 19 of one and the same functional unit (for example, the cables 17 in FIG. 1).

The coaxial connectors 61 are mounted on the mounting beam 47 before the mounting beam 47 is suspended from the pins 57, so that optimum accessibility and maneuverability of the connectors is obtained. This is also partly due to the fact that the height (in the vertical direction in the mounted condition) of the mounting beam 47 is substantially smaller than the height of the positioning plate 35 which is to be mounted at a later stage. After all coaxial connectors 61 have been secured on the mounting beam 47, the beam is suspended from the pins 57. Because the positioning plate 35 itself is aligned again with respect to the mounting beam 47, the coaxial connectors 61 have thus been prealigned with respect to the pattern of holes 63 in the positioning plate 35. Because the functional unit 25 itself is aligned again with respect to the positioning plate 35, the coaxial connectors have also been prealigned with respect to the mating coaxial connectors 65 which are situated on the signal processing boards 19 which are to be slid into the functional unit 25 at a later stage. The alignment of the positioning plate 35 with respect to the suspended mounting beam 47 is realised by means of alignment tags 83 and 85 which are formed on the mounting beam 47 and which fit in relevant holes 87 and 89 provided in the positioning plate 35 (see FIGS. 2 and 5). A third alignment tag 91 of the mounting beam 47 fits in a hole 93 of the positioning plate 35. After alignment of the positioning plate 35 with respect to the mounting beam 47, the mounting beam which is still movably suspended from the pins 57 is screwed to the positioning plate 35. This is effected by means of at least two screws 95 and 97 which are screwed into threaded holes in the mounting beam 47. Only one threaded hole 99 is visible in FIG. 2. The alignment of the functional unit 25 with respect to the positioning plate 35 is realised by means of an alignment tag 101 which is punched from the positioning plate 35 and which fits in a slot 102 formed in the bottom plate of the functional unit 25. After the positioning plate 35 has been secured to the mounting beam 47, the positioning plate 35 is screwed to the supporting beams 1 and 3 by means of screws 103 which are secured in the positioning plate 35 at the left (not visible) as well as at the right and which are prevented from falling out of the positioning plate 35 by means of threaded bushes 105 which also determine the distance between the positioning plate 35 and the supporting beams 1 and 3. Subsequently, the functional unit 25 is screwed to the positioning plate 35, after which the signal processing boards 19 are inserted into the functional unit 35. Simultaneously per signal processing board 19, the row connectors 77 are connected to the row connectors 41, the mating coaxial connectors 73 are connected to the coaxial connectors 71, and the mating coaxial connectors 65 are connected to the coaxial connectors 61 (see FIG. 3).

In order to prevent the extremely small manufacturing tolerances of notably the positioning plate 35 and the mounting beam 47 from having a cost-increasing effect, a given clearance is provided between the coaxial connectors 61 and the holes 59 and 63 in the mounting beam 47 and the positioning plate 35, respectively. This clearance is denoted by the reference numeral 107 for the positioning plate 35 and by the reference numeral 109 for the mounting beam 47 in FIG. 9. In principle, the clearances 107 and 109 may be the same. Obviously, said clearances are also attuned to the permissible plugging tolerance of the coaxial connectors. The coaxial connection 69, formed by the connection of the coaxial pin connector 61 to the coaxial socket connector 65 as well as by the bushes 110 and 112 is of a customary construction. However, of essential importance are the clearances 107 and 109 for the outer parts of the connection which project through the positioning plate 35 and the mounting beam 47. It is also to be noted that, after the said connection has been established, it is not necessary to eliminate the lateral slidability in the holes 63 and 65 by the tightening of a nut 111 and a spacing bush 113. It is sufficient to lightly tighten the nut 111 and the bush 113.

The increased data flow per cable and the increased miniaturisation of the electrical components on the signal processing boards 19 have given rise to a greater development of heat than previously in the functional units 25. Because the signal processing boards 19 are vertically arranged in the functional units 25 (see FIG. 1) and because the functional units 25 are provided with circulation apertures 115 (see FIG. 10), use can be made of the natural draught of heated air. If necessary, this natural draught can be supplemented by forced cooling. Forced cooling of this kind, however, is not necessary in a considerable number of cases, if, like in a preferred embodiment of the described bay, use is made of a roof-shaped guiding device 117 which is mounted each time between two functional units 25 and which serves as a cooling device. The comparatively cold air entering in accordance with the arrows 119 can rise between the signal processing boards 19 (not shown for the sake of simplicity) according to the broken lines 121, and can escape according to the arrow 125 through a window 123 in the guiding device 117.

It will be clear that the bay in accordance with the invention is not restricted to a given type of cable such as said coaxial cables. Fibre-optic telecommunication cables presently being developed can also be advantageously used in the described bay. The alignment of the likewise coaxial connector parts is of major importance for such a type of cable.

What is claimed is:

1. An electrical signal transmission equipment bay comprising two parallel supporting beams having cable guide beams extending directly transversely of the supporting beams said cable guide beams being situated in the first vertical plane, and having cables, going into and out of the bay which are guided along the cable guide beams, said cables extending mainly parallel to said supporting beams inside the bay, the ends of a number of said cables being provided with a plurality of row connectors electrically connected to a plurality of plug-in signal processing boards, each of said plug-in signal boards positioned in one of a plurality of functional units situated in said bay, a plurality of positioning plates each one connected to a respective functional unit, successive first row connectors being situated on a positioning plate for a respective functional unit, a master printed wiring board which is connected to one of said positioning plates, and second row connectors which are connected to said one positioning plate and into which a signal processing board is plugged, wherein said supporting beams are provided with at least one mounting beam which extends transversely to the supporting beams and on which are positioned a number of coaxial connectors each connected to the end of one of said cables, said coaxial connectors cooperating, via a number of openings in a respective positioning plate, with a number of mating coaxial connectors which are provided on said signal processing boards in a respective functional unit, said at least one mounting beam being adapted for detachable suspension from said supporting beams during the positioning of said coaxial connections on said at least one mounting beam, and being adapted for subsequent rigid connection to said positioning plate prior to rigid connection of each of said positioning plates to said supporting beams.

2. A bay as claimed in claim 1 wherein said at least one mounting beam as well as one of said positioning plates is provided with openings through which the coaxial connections are inserted with clearance.

3. A bay as claimed in claim 2 wherein said at least one mounting beam comprises ears whereby said at least one mounting beam is suspended from pins which are secured to said supporting beams, said at least one mounting beam being displaceable with respect to said pins in the suspended condition.

4. A bay as claimed in claim 3 wherein said bay comprises a parking beam for said first and second row connectors on the ends of cables which are situated in a second vertical plane, transversely of said supporting beams, all the cables extending in a chute-like space between said first and second vertical planes, each said positioning plate being provided with windows for insertion of the row connectors previously positioned on said parking beam.

5. A bay as claimed in claim 4 wherein each signal processing board in a functional unit is provided with a row connector on one of said positioning plates.

6. A bay as defined in claim 5 wherein each said positioning plate comprises a positioning tag which fits in a recess of a respective functional unit, whilst said at least one mounting beam comprises positioning means which cooperate with positioning means on one of said positioning plates.

7. A bay as claimed in claim 6 wherein said signal processing boards are vertically arranged in said functional units and said bay has a roof-shaped guiding device for the inlet and outlet of cooling air situated between said functional units.

8. An electrical signal transmission equipment bay comprising at least one vertical supporting beam, a plurality of cables going into and out of the bay being guided parallel to said supporting beam, a plurality of row connectors, a plurality of plug-in signal processing boards, a plurality of functional units, a plurality of positioning plates, the ends of a number of said cables being provided with a plurality of row connectors electrically connected to a plurality of plug-in signal processing boards, each of said signal boards positioned in one of a plurality of functional units situated in said bay, a plurality of positioning plates each one connected to a respective functional unit, successive first row connectors being situated on a respective positioning plate for a respective functional unit, a master board connected to one of said positioning plates, and second row connectors being connected to said one positioning plate into which one of said signal processing boards is plugged, a mounting beam positioned transversely of said at least one vertical supporting beam, and a plurality of coaxial connectors positioned on said mounting beam, said coaxial connectors being connected to a number of said cables which are of the coaxial type and cooperating via a plurality of openings in said positioning plates with a plurality of mating coaxial connectors which are provided on said signal processing boards, said mounting beam being detachably suspended from said at least one supporting beam during the mounting of said coaxial connectors and being rigidly connected to said one positioning plate after the mounting of said one positioning plate which itself is connected to said at least one vertical supporting beam.

* * * * *